(12) United States Patent
Lee

(10) Patent No.: US 9,332,641 B2
(45) Date of Patent: May 3, 2016

(54) CONNECTION STRUCTURE OF CIRCUIT BOARD

(71) Applicant: Samsung Display Co., Ltd., Yongin, Gyeonggi-do (KR)

(72) Inventor: Jin-Suk Lee, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 308 days.

(21) Appl. No.: 14/024,021

(22) Filed: Sep. 11, 2013

(65) Prior Publication Data
US 2014/0127916 A1    May 8, 2014

(30) Foreign Application Priority Data

Nov. 8, 2012 (KR) .................... 10-2012-0126119

(51) Int. Cl.
| | |
|---|---|
| *H05K 1/11* | (2006.01) |
| *H05K 1/02* | (2006.01) |
| *H01R 12/52* | (2011.01) |
| *H05K 3/36* | (2006.01) |
| *H05K 3/32* | (2006.01) |

(52) U.S. Cl.
CPC ............... *H05K 1/117* (2013.01); *H01R 12/52* (2013.01); *H05K 1/0248* (2013.01); *H05K 1/118* (2013.01); *H05K 3/361* (2013.01); *H05K 3/323* (2013.01); *H05K 2201/09709* (2013.01); *H05K 2201/09909* (2013.01)

(58) Field of Classification Search
CPC ... H05K 1/117; H05K 1/0248; H05K 1/0246; H05K 1/111; H05K 1/14

USPC .......................................................... 174/259
See application file for complete search history.

(56) References Cited

U.S. PATENT DOCUMENTS

| 5,306,541 A * | 4/1994 | Kasatani ...................... 428/192 |
| 8,350,162 B2 | 1/2013 | Kim et al. |

FOREIGN PATENT DOCUMENTS

| JP | 2004-221345 A | 8/2004 |
| JP | 2006-332465 A | 12/2006 |
| JP | 2011-244006 A | 12/2011 |
| KR | 10-2010-0106749 A | 10/2010 |

OTHER PUBLICATIONS

Panasonic, Machine Translation of JP 2011-24406, Dec. 1, 2011.*

* cited by examiner

*Primary Examiner* — Jeremy C Norris
(74) *Attorney, Agent, or Firm* — Knobbe, Martens, Olson & Bear, LLP

(57) ABSTRACT

A connection structure of a circuit board is disclosed. In one aspect, the connection structure includes a first circuit board, a second circuit board and an adhesive member. A first connection pad and a second connection pad are disposed on the first circuit board. The second circuit board has a first surface facing the first circuit board. A plurality of third connection pads and fourth connection pads are disposed on the first surface of the second circuit board in a staggered pattern. The adhesive member is disposed between the first and second circuit boards. At least one of the third and fourth connection pads is electrically connected to a wire which is disposed on a second surface of the second circuit board opposite to the first surface of the second circuit board.

13 Claims, 11 Drawing Sheets

FIRST
DIRECTION
⊗ → SECOND
     DIRECTION

FIRST
DIRECTION
⊗ → SECOND
     DIRECTION

CONNECTION STRUCTURE OF CIRCUIT BOARD

CROSS-REFERENCE TO RELATED APPLICATION

This application claims priority under 35 USC §119 to Korean Patent Application No. 10-2012-0126119, filed on Nov. 8, 2012, in the Korean Intellectual Property Office (KIPO), the contents of which are herein incorporated by reference in their entirety.

BACKGROUND

1. Field

The described technology generally relates to a connection structure of a circuit board.

2. Description of the Related Technology

In general, a liquid crystal display (LCD) or an organic light emitting diode (OLED) display includes a switching device such as a thin film transistor (TFT) and a light emitting device disposed on a display substrate. In order to apply a driving signal to the switching device, a circuit board including a driver integrated circuit (IC) for generating the driving signal must be electrically connected to the display substrate. Generally, a flexible printed circuit board (FPCB) is disposed between the circuit board and the display substrate to connect the circuit board to the display substrate.

SUMMARY

One inventive aspect is a connection structure between a first circuit board and a second circuit board.

Another aspect is a connection structure of a circuit substrate capable of preventing electrical short.

Another aspect is a connection structure of a circuit board which includes a first circuit board, a second circuit board and adhesive member. A first connection pad and a second connection pad are disposed on the first circuit board. The second circuit board has a first surface facing the first circuit board. A plurality of third connection pads and fourth connection pads are disposed on the first surface of the second circuit board in a staggered pattern. The adhesive member is disposed between the first circuit board and the second circuit board. At least one of the third connection pad and the fourth connection pad is electrically connected to a wire which is disposed on a second surface of the second circuit board opposite to the first surface of the second circuit board.

In example embodiments, the third connection pads and the fourth connection pads may be alternately and repeatedly disposed in a second direction, and the third connection pads may be disposed closer to an end of the second circuit board as compared with the fourth connection pads in a first direction substantially perpendicular to the second direction In example embodiments, each of the third connection pads may be electrically connected to a second wire disposed on the second surface of the second circuit board, and each of the fourth connection pads may be electrically connected to a first wire disposed on the first surface of the second circuit board.

In example embodiments, the second circuit board may further comprise fifth connection pads disposed on the second surface, and each of the fifth connection pads may be electrically connected to each of the third connection pads through a first contact formed through the second circuit board while being directly connected to each of the second wires.

In example embodiments, the second circuit board may further comprise a dummy pad disposed between the fifth connection pads.

In example embodiments, the dummy pad may have a height equal to a height of the fifth connection pad, and may comprise an insulation material In example embodiments, each of the third connection pads may be electrically connected to a second wire disposed on the second surface of the second circuit board, and each of the fourth connection pads may be electrically connected to a first wire disposed on the second surface of the second circuit board.

In example embodiments, the second circuit board may further comprise fifth connection pads and sixth connection pads which are disposed on the second surface, each of the fifth connection pads may be electrically connected to each of the third connection pads through a first contact formed through the second circuit board while being directly connected to each of the second wires, and each of the sixth connection pads may be electrically connected to each of the fourth connection pads through a second contact formed through the second circuit board while being directly connected to each of the first wires In example embodiments, the second circuit board may further comprise a dummy pad disposed between the fifth connection pads.

In example embodiments, the dummy pad may have a height equal to a height of the fifth connection pad, and comprises an insulation material.

In example embodiments, the first connection pad and the second connection pad may be disposed in a staggered pattern In example embodiments, the first connection pad and the second connection pad may be electrically connected to a third wire disposed on an upper surface of the first circuit board, respectively.

In example embodiments, the first connection pad and the second connection pad may be electrically connected to a third wire disposed inside the first circuit board or at a lower surface of the first circuit board.

Another aspect is a second circuit board which includes a third connection pad, a fourth connection pad, a first wire, and a second wire. The third connection pad and the fourth connection pad can be disposed in a staggered pattern, and the first wire electrically connected to the fourth connection pad can be spaced apart from the second wire electrically connected to the third connection pad. Accordingly, adjacent conductors can be spaced apart from each other at a predetermined distance or more and the short can be reduced.

BRIEF DESCRIPTION OF THE DRAWINGS

Example embodiments will be more clearly understood from the following detailed description taken in conjunction with the accompanying drawings.

FIGS. 1 to 6 are a perspective view, plan views, and cross-sectional views illustrating a connection structure of a circuit board according to example embodiments.

FIGS. 7 to 11 are a perspective view, plan views, and cross-sectional views illustrating a connection structure of a circuit board according to example embodiments.

FIGS. 12 and 13 are a perspective view and a plan view illustrating a connection structure of a circuit board according to example embodiments, respectively.

DETAILED DESCRIPTION

Figure 1:
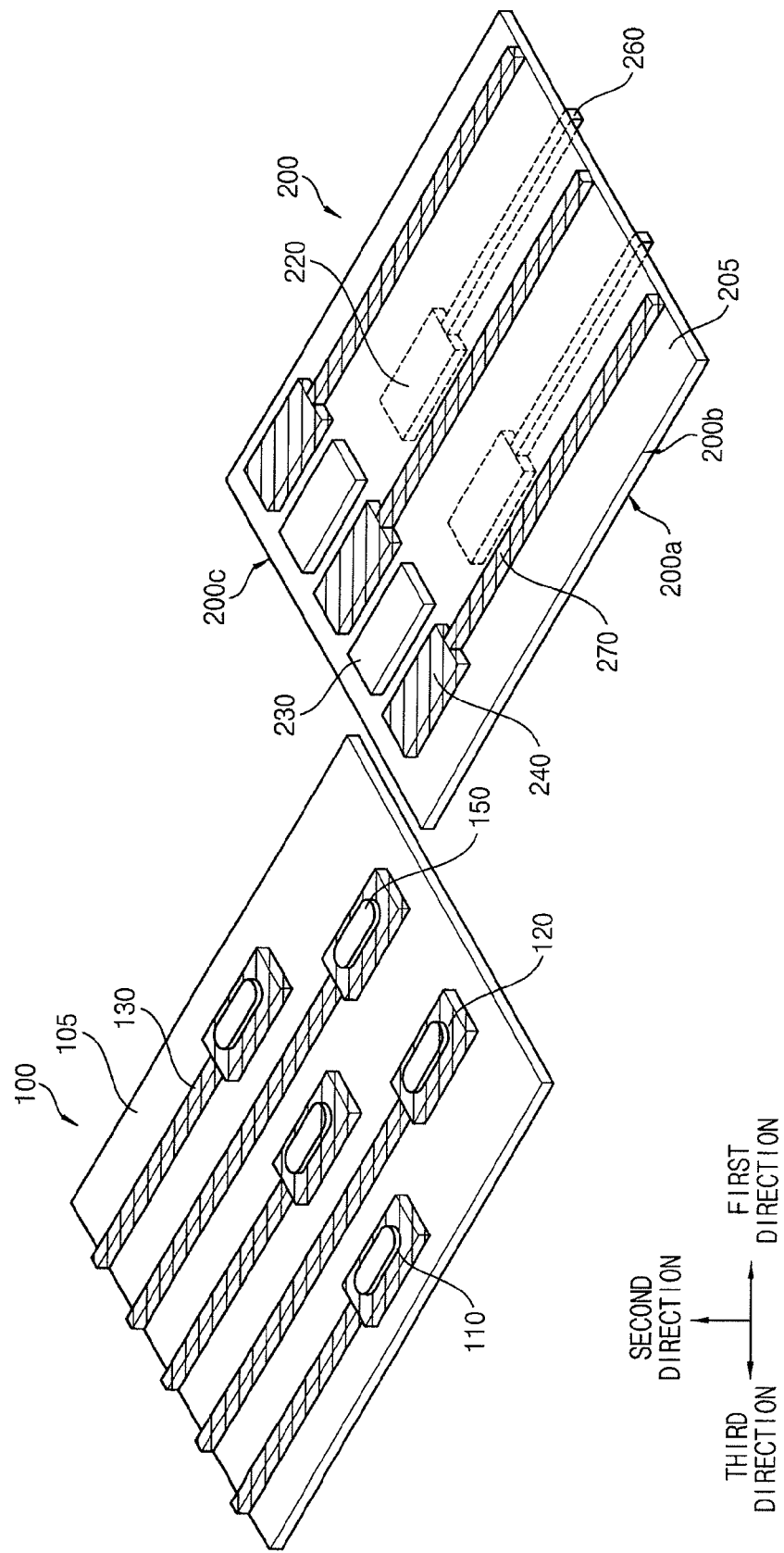
FIGS. 1 to 13 represent non-limiting, example embodiments as described herein.

Generally, an FPCB includes a plurality of wires for electric connection. A high-resolution display generally includes more wires in one FPCB by reducing an interval between the wires. However, when the interval between the wires is reduced, a short circuit may occur at a connection part between a substrate and a circuit board.

Hereinafter, example embodiments will be described in detail with reference to the accompanying drawings.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 6 are a perspective view, plan views, and cross-sectional views illustrating a connection structure of a circuit board according to example embodiments.

Figure 2:
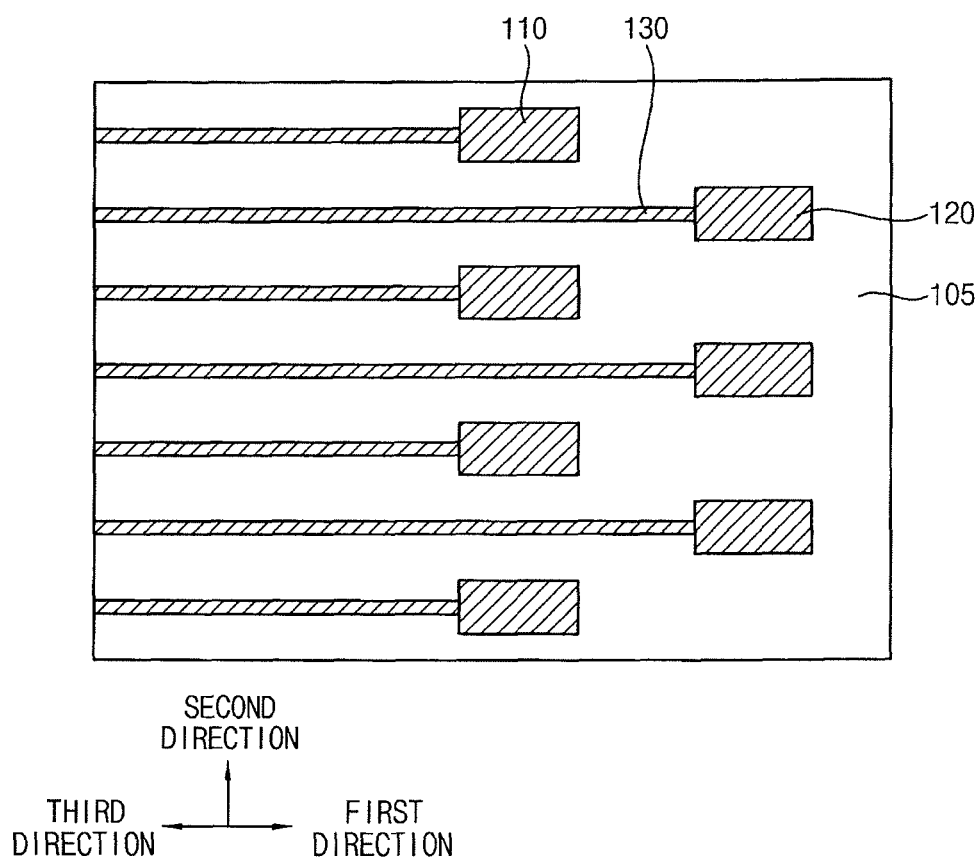
Figure 3:
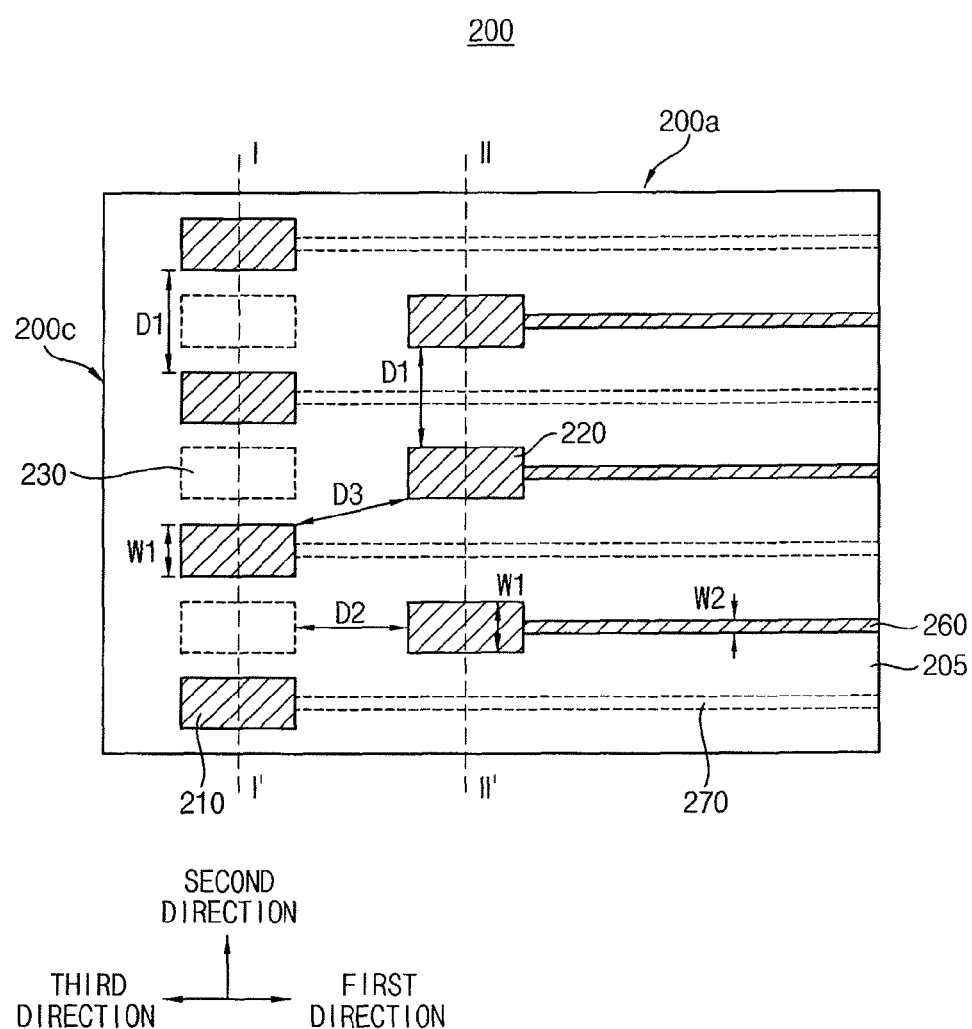
Figure 4:
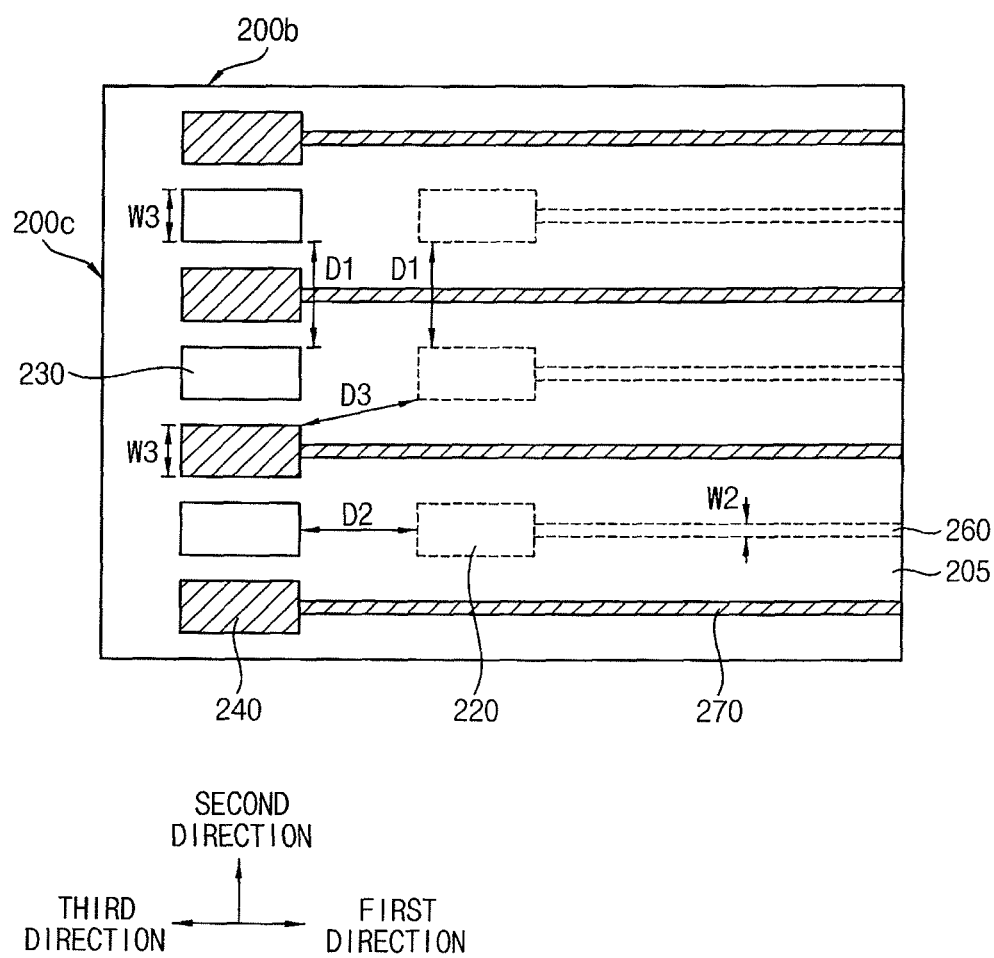

FIG. 1 is a perspective view illustrating a connection structure of a circuit board according to example embodiments, FIG. 2 is a plan view illustrating an upper surface of a first circuit board 100 according to example embodiments. FIGS. 3 and 4 are plan views illustrating an upper surface and a lower surface of a second circuit board 200 according to example embodiments, respectively. For the purpose of convenience of explanation, a fourth connection pad 220 and a first wire 260 disposed at a hidden surface of the second circuit board 200 are illustrated in a dotted line in FIGS. 1 and 4, and a dummy pad 230 and a second wire 270 disposed at the hidden surface of the second circuit board 200 are illustrated in a dotted line in FIG. 3.

Referring to FIG. 1, the connection structure of a circuit board includes the first circuit board 100, the second circuit board 200, and an adhesive member 150 disposed between the first and second circuit boards 100 and 200.

In some example embodiments, the first circuit board 100 may be a rigid circuit board, and the second circuit board 200 may be a flexible circuit board. For example, the first circuit board 100 may be a driver IC substrate applying a signal to a display panel of an organic light emitting display or a display substrate attached to the display panel. The second circuit board 200 may be an FPCB electrically connecting the driver IC substrate to the display substrate.

Referring to FIGS. 1 and 2, the first circuit substrate 100 may include a first base layer 105, and a first connection pad 110, a second connection pad 120, and a third wire 130 which are disposed on an upper surface of the base layer 105.

When viewed from a top, the first connection pad 110 and the second connection pad 120 may be disposed on the upper surface of the base layer 105 in a staggered pattern (that is, a zig-zag pattern). That is, the first and second connection pads 110 and 120 may be alternately and repeatedly disposed in a second direction. Furthermore, the first connection pads 110 may be aligned in a third direction substantially perpendicular to the second direction, and the second connection pads 120 may be aligned in a first direction opposite to the third direction. That is, the first connection pads 110 may be disposed while being shifted in the third direction as compared with the second connection pads 120. Accordingly, the first connection pads 110 may not overlap with the second connection pads 120 in the first direction or the second direction.

In some example embodiments, as shown in FIG. 2, the first connection pad 110 and the second connection pad 120 may have rectangular shapes with the substantially same size when viewed from the top. However, the example embodiments are not limited thereto. For example, the connection pads 110 and 120 may have various shapes, such as a square shape, a hexagonal shape, a circular shape, an elliptical shape, and a polygonal shape when viewed from the top. In addition, the first connection pad 110 may have a shape different from the shape of the second connection pad 120 when viewed from the top. In other example embodiments, the first connection pad 110 may have a size different from the size of the second connection pad 120.

Meanwhile, each of the first and second connection pads 110 and 120 may be electrically connected to the third wire 130, which is disposed at an upper surface of the first base layer 105, respectively. A plurality of third wires 130 may be disposed in the second direction. In some example embodiments, each of the third wires 130 may extend from one end of the third connection pad 110 or the second connection pad 120 in the third direction.

The first connection pads 110, the second connection pads 120, and the third wires 130 may include a conductive material. The first connection pads 110, the second connection pads 120, and the third wires 130 may include metal such as copper (Cu), tungsten (W), silver (Ag), or aluminum (Al). In some example embodiments, when the first connection pads 110, the second connection pads 120, and the third wires 130 are formed by a copper foil, the connection structure of the circuit board may have low electric resistance.

Referring to FIGS. 1, 3, and 4, the second circuit board 200 may include a second base layer 205, a third connection pad 210, a fourth connection pad 220, a dummy connection pad 230, a fifth connection pad 240, a first wire 260, and a second wire 270.

The second base layer 205 may have two surfaces which are opposite to each other. In this case, a surface facing an upper surface of the first circuit board 100 is defined as a first surface 200a of the second circuit board 200, and a surface opposite to the first surface 200a is defined as a second surface 200b of the second circuit board 200. Further, the second circuit board 200 may include a first end 200c in the third direction.

For example, the second circuit board 200 may be an FPCB. In some example embodiments, the second base layer 205 may include a flexible polymer such as polyimide (PI), polyethylene terephthalate (PET), and polyethylene naphthalate (PEN).

Referring to FIG. 3, the third connection pad 210, the fourth connection pad 220, and the first wire 260 may be disposed on the first surface 200a of the second circuit board 200.

In some example embodiments, the third connection pads 210 may be disposed at a location corresponding to the first connection pads 110 of the first circuit board 100, and the fourth connection pads 220 may be disposed at a location corresponding to the second connection pads 120.

When viewed from the top, the third connection pads 210 and the fourth connection pads 220 may be disposed in a staggered pattern. That is, the third connection pads 210 and the fourth connection pads 220 may be alternately and repeatedly disposed in the second direction, and the third connection pads 210 may be disposed while being shifted in the third direction as compared with the fourth connection pads 220. That is, the third connection pads 210 may be disposed adjacent to the first end 200c as compared with the fourth connection pads 220. Accordingly, the third connection pads 210 may not overlap with the fourth connection pads 220 in the first direction or the second direction.

In some example embodiments, as shown in FIG. 3, the third connection pad 210 and the fourth connection pad 220 may have rectangular shapes with the substantially same size when viewed from the top. However, the example embodiments are not limited thereto. For example, the third connection pads 210 and the fourth connection pads 220 may have various shapes, such as a square shape, a hexagonal shape, a circular shape, an elliptical shape, and a polygonal shape when viewed from the top. The third connection pad 210 may have a shape different from that of the fourth connection pad 220 when viewed from the top. In other example embodiments, the third connection pad 210 may have a size different from that of the fourth connection pad 220.

In some example embodiments, each of the third and fourth connection pads 210 and 220 may have a first width W1 in the second direction. In this case, adjacent third connection pads 210 may be spaced apart from each other in the second direction by a first distance D1, and adjacent fourth connection pads 220 may be spaced apart from each other in the second direction by the first distance D1. The third connection pad 210 may be spaced from the fourth connection pad 220 by a second distance D2 in the first direction. In some example embodiments, the shortest distance between the third connection pad 210 and the fourth connection pad 220 may be defined as a third distance D3, and the third distance D3 may be substantially greater than the first distance D1. That is, the connection pads 210 and 220 disposed in the staggered pattern may be spaced apart from each other by the first distance D1 or more.

Each of the fourth connection pads 220 may be electrically connected to the first wire 260 disposed on the first surface 200a of the second circuit board 200. A plurality of first wires 260 may be disposed in the second direction while extending in the first direction from one end of the fourth connection pads 220. In this case, each of the first wires 260 may have a second width W2 in the second direction smaller than the first width W1, and the first wires 260 adjacent to each other in the second direction may be spaced apart from each other by a distance greater than the first distance D1.

Referring to FIG. 4, the dummy connection pad 230, the fifth connection pad 240, and the second wire 270 may be disposed on the second surface 200b of the second circuit board 200.

The dummy connection pads 230 and the fifth connection pads 240 may be alternately and repeatedly disposed in the second direction. In this case, each of the fifth connection pads 240 may be disposed at a location corresponding to each of the third connection pads 210, and the dummy connection pads 230 may be disposed between the fifth connection pads 240. Accordingly, adjacent fifth connection pads 240 may be spaced apart from each other by the first distance D1.

The dummy connection pad 230 and the fifth connection pad 240 may have various shapes when viewed from the top and may have the same size or different sizes. In some example embodiments, each of the dummy connection pads 230 and the fifth connection pad 240 may have a third width W3 in the second direction.

Figure 5:
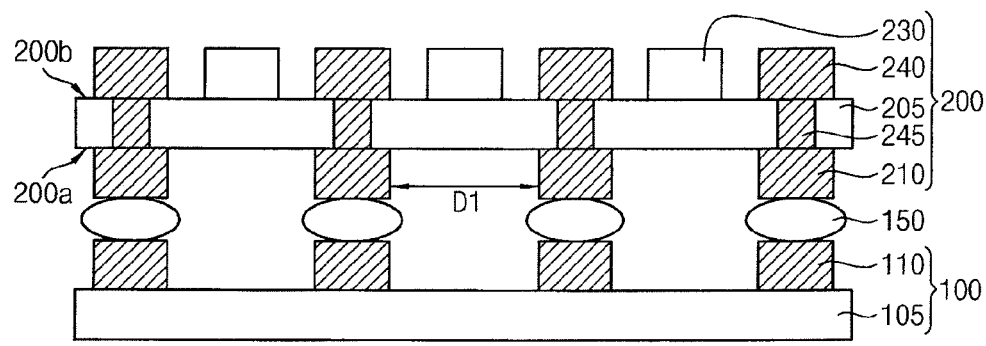

The dummy connection pad 230 may have a height substantially the same as the height of the fifth connection pad 240 (see FIG. 5). Accordingly, when bonding the second circuit board 200 onto the first circuit board 100, the same pressure may be applied to the dummy connection pads 230 and the fifth connection pads 240. As a result, the first circuit board 100 may be uniformly bonded to the second circuit board 200. That is, the dummy connection pad 230 does not perform an electric function, but may allow the pressure to be uniformly applied to the second circuit board 200 in the connection procedure of the circuit board.

Each of the fifth connection pads 240 may be electrically connected to the second wire 270 disposed on the second surface 200b of the second circuit board 200. A plurality of second wires 270 may be disposed in the second direction while extending in the first direction from one end of the fifth connection pads 240. In this case, the second wire 270 may have a second width W2 smaller than the first width W1, and second adjacent wires 270 may be spaced apart from each other by a distance greater than a first distance D1 in the second direction.

The fifth connection pads 240 and the second wires 270 may include a conductive material, whereas the dummy connection pads 230 may include an insulation material. In some example embodiments, the fifth connection pads 240 and the second wires 270 may include a conductive metal such as copper (Cu).

Figure 6:
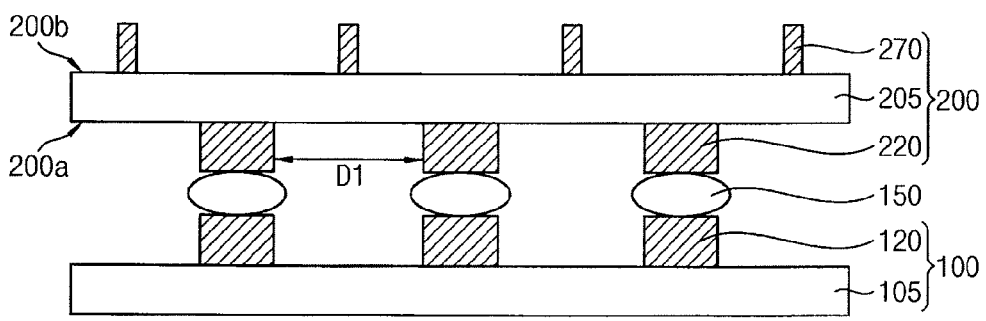

FIG. 5 is a cross-sectional view taken along line I-I' of FIG. 3 and FIG. 6 is a cross-sectional view taken along line II-II' of FIG. 3 when a circuit board is connected.

Referring to FIG. 5, a plurality of contacts 245 including a conductive material may be formed through the second base layer 205 of the second circuit board 200. Accordingly, each of the third connection pads 210 may be electrically connected to each of the fifth connection pads 240 through the contact 245.

Referring to FIG. 6, as described above, the second wires 270 may be disposed on the second surface 200b opposite to the fourth connection pad 220. If the second wire 270 is disposed on the first surface 200a, the second wires 270 may be spaced apart from the fourth connection pads 220 by a distance shorter than the first distance D1. If a distance between adjacent conductors is reduced, an electrical short may be caused easily. In some example embodiments, since the second wires 270 are disposed on the second surface 200b, a distance between adjacent conductors (that is, connection pads and a wire) is increased so that the electrical short may be prevented.

The adhesive member 150 may be disposed between the first circuit board 100 and the second circuit board 200. In detail, the adhesive member 150 may be disposed between the first connection pad 110 of the first circuit board 100 and the third connection pad 210 of the second circuit board 200, and may be disposed between the second connection pad 120 of the first circuit board 100 and the fourth connection pad 220 of the second circuit board 200.

The adhesive member 150 may include a material having conductivity and high adhesion property. In some example embodiments, the adhesive member 150 may include an anisotropic conductive film. The anisotropic conductive film may include a fine conductive particle such as nickel (Ni), carbon, and a solder ball, and an adhesive polymer. The adhesive member 150 may not only electrically connect the connection pads 110, 120, 210, and 220 to each other, but also mechanically bond the connection pads 110, 120, 210, and 220 to each other.

Pressure may be applied to the adhesive member 150 during a procedure of bonding the second circuit board 200 on the first circuit board 100, and accordingly, a shape of the adhesive member 150 may be deformed. If a spacing distance between adjacent conductors (that is, a pad or a wire) is reduced, the adhesive member 150 electrically connects undesirable conductors to each other so that the electrical short may be caused easily.

In some example embodiments, the third and fourth connection pads 210 and 220 may be disposed in a staggered pattern. The first wires 260 electrically connected to the fourth connection pads 220 and the second wires 270 electrically connected to the third connection pads 210 may be disposed at surfaces 200a and 200b opposite to each other, respectively. Accordingly, adjacent conductors may be spaced apart from each other by the first distance D1 or more, so the chances of an electrical short circuit may be reduced.

FIGS. 7 to 11 are a perspective view, plan views, and cross-sectional views illustrating a connection structure of a circuit board according to example embodiments. The connection structure of the circuit board shown in FIGS. 7 to 11 is substantially similar to the connection structure of the circuit board described with reference to FIGS. 1 to 6. Accordingly, the similar reference numbers will be used throughout the drawings to refer to the similar parts, and a detailed description thereof will be omitted.

Figure 7:
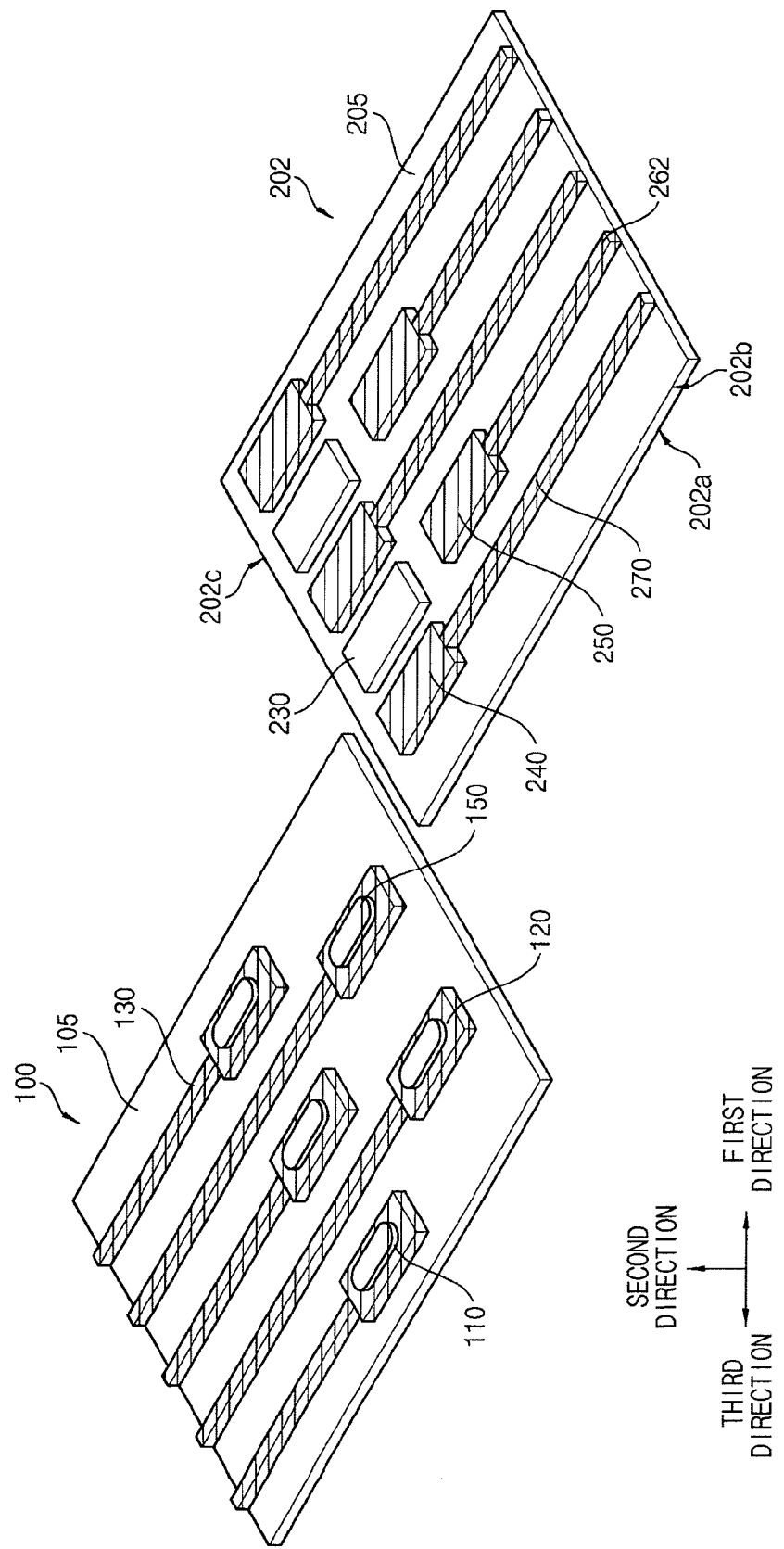
Figure 8:
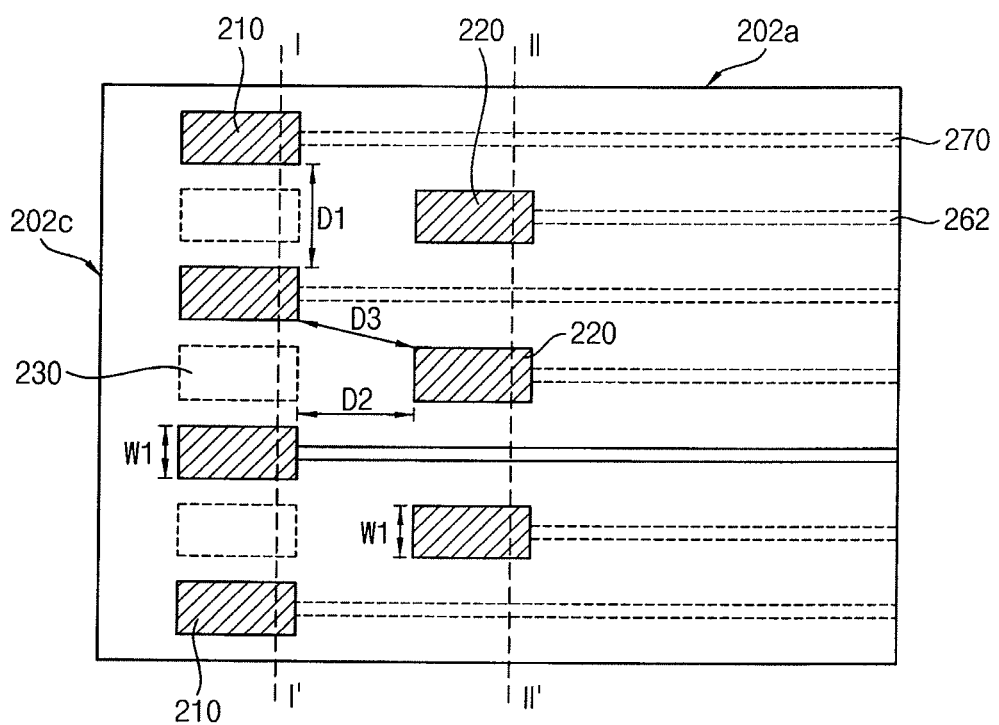
Figure 8:
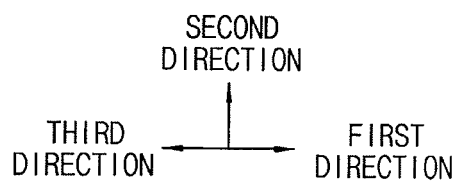
Figure 9:
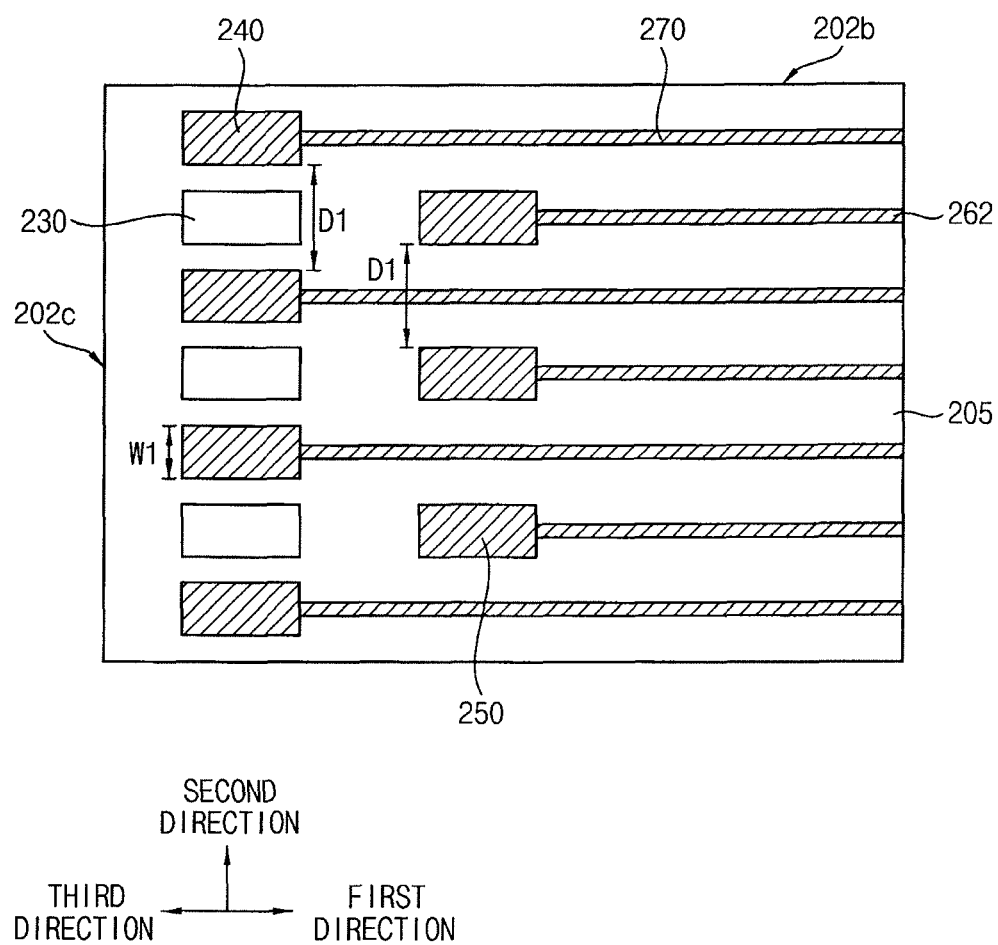

FIG. 7 is a perspective view illustrating a connection structure of a circuit board according to example embodiments, and FIGS. 8 and 9 are plan views illustrating an upper surface and a lower surface of a second circuit board 202, respectively. For the purpose of convenience of explanation, the dummy pad 230 and the second wire 270 disposed at a hidden surface of the second circuit board 202 are illustrated in a dotted line in FIG. 8.

Referring to FIG. 7, the connection structure of the circuit board includes a first circuit board 100, the second circuit board 202, and an adhesive member 150 disposed between the first circuit board 100 and the second circuit board 202.

The first circuit board 100 is substantially the same as the first circuit board 100 described with reference to FIGS. 1 and 2.

Referring to FIGS. 7 and 8, the second circuit board 202 may include a second base layer 205, a third connection pad 210, a fourth connection pad 220, a dummy connection pad 230, a fifth connection pad 240, a sixth connection pad 250, a first wire 262, and a second wire 270.

The second base layer 205 may include a first surface 202a facing a upper surface of the first circuit board 100 and a second surface 202b opposite to the first surface 202a. The second circuit board 202 may include a first end 202c in the third direction.

Referring to FIG. 8, the third connection pad 210 and the fourth connection pad 220 may be disposed on the first surface 202a of the second circuit board 202.

Each of The third connection pads 210 may be disposed at a location corresponding to each of the first connection pads 110 of the first circuit board 100, and each of the fourth connection pads 220 may be disposed at a location corresponding to each of the second connection pads 120. The third and fourth connection pads 210 and 220 may be alternately and repeatedly disposed in a staggered pattern in the second direction. That is, the third connection pads 210 may be closer to the first end 202c than the fourth connection pads 220. In some example embodiments, the connection pads 210 and 220 may have a first width W1 in the second direction. In this case, adjacent third connection pads 210 may be spaced apart from each other in the second direction by a first distance D1, and adjacent fourth connection pads 220 may be spaced part from each other in the second direction by the first distance D1. The third connection pads 210 may be spaced apart from the fourth connection pads 220 in the first direction by a second distance D2. In some example embodiments, the shortest distance between the connection pads 210 and 220 may be defined as a third distance D3, and the third distance D3 may be substantially greater than the first distance D1.

Referring to FIG. 9, the dummy connection pad 230, the fifth connection pad 240, the sixth connection pad 250, the first wire 262, and the second wire 270 may be disposed on the second surface 202b of the second circuit board 202.

The dummy connection pads 230 and the fifth connection pads 240 may be alternately and repeatedly disposed in the second direction, and the sixth connection pads 250 may be substantially aligned with the dummy connection pads 230 in the first direction. In this case, each of the fifth and sixth connection pads 240 and 250 may be disposed at locations corresponding to each of the third and fourth connection pads 210 and 220, respectively. The dummy connection pad 230 may be disposed between the fifth connection pads 240. Accordingly, the adjacent fifth connection pads 240 may be spaced apart from each other by the first distance D1, and the adjacent sixth connection pads 250 may be spaced apart from each other by the first distance D1.

The first wires 262 and the second wires 270 may be alternately and repeatedly disposed in the second direction. In some example embodiments, the fifth connection pads 240, the sixth connection pads 250, the first wires 262, and the second wires 270 may include a conductive metal such as copper (Cu), whereas the dummy connection pad 230 may include an insulation material.

Figure 10:
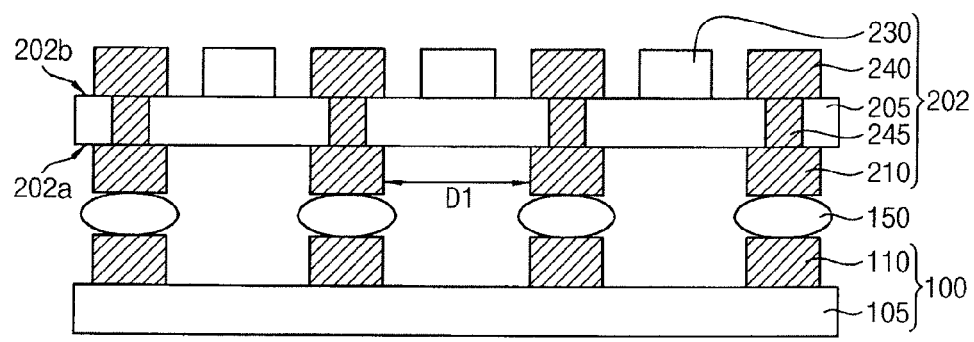
Figure 11:
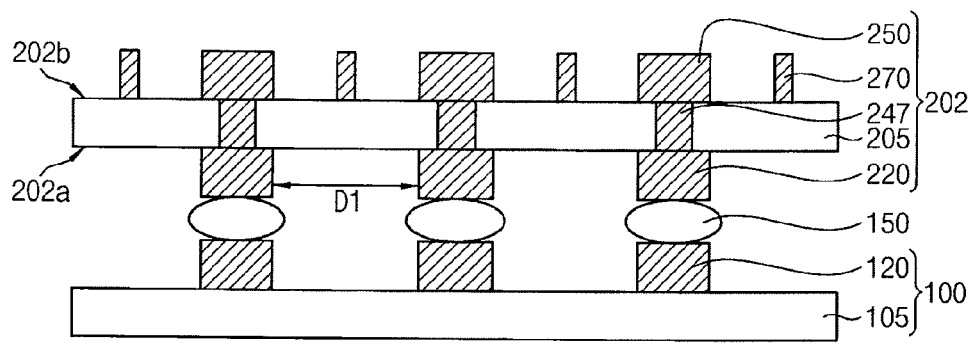

FIG. 10 is a cross-sectional view taken along line I-I' of FIG. 8 and FIG. 11 is a cross-sectional view taken along line II-II' of FIG. 8 when a circuit board is connected.

Referring to FIG. 10, a plurality of first contacts 245 including a conductive material may be formed through the second base layer 205 of the second circuit board 202. Accordingly, each of the third connection pads 210 may be electrically connected to each of the fifth connection pads 240.

Referring to FIG. 11, a plurality of second contacts 247 including a conductive material may be formed through the second base layer 205 of the second circuit board 202. Accordingly, each of the fourth connection pads 220 may be electrically connected to each of the sixth connection pads 250.

Further, the second wires 270 may be disposed on the second surface 202b opposite to the fourth connection pad 220. If the second wires 270 are disposed on the first surface 202a, the second wires 270 may be spaced apart from the fourth connection pad 220 by a distance shorter than the first distance D1. If a distance between adjacent conductors is reduced, an electrical short may be caused easily. In some example embodiments, since the second wires 270 are disposed on the second surface 200b, the distance between adjacent conductors (for example, the second wire 270 and the fourth connection pad 220) increases so that a short circuit may be prevented.

The adhesive material 150 may be disposed between the first and second circuit boards 100 and 202, and may include an anisotropic conductive film. In detail, the adhesive member 150 may be disposed between the first connection pad 110 of the first circuit board 100 and the third connection pad 210 of the second circuit board 202, and may be disposed between the second connection pad 120 of the first circuit board 100 and the fourth connection pad 220 of the second circuit board 202.

Pressure may be applied to the adhesive member 150 during a procedure of bonding the second circuit board 200 to the first circuit board 100, and accordingly, a shape of the adhesive member 150 may be deformed. If a spacing distance between adjacent conductors (that is, a pad or a wire) is short, the adhesive member 150 may electrically connect undesirable conductors to each other so that short may be caused. In some example embodiments, the third connection pads 210 and the fourth connection pads 220 may be disposed in a staggered pattern. In addition, each of the first wires 260 electrically connected to each of the fourth connection pads 220 and each of the second wires 270 electrically connected to each of the third connection pads 210 may be disposed on the second surface 202b opposite to the adhesive member 150. Accordingly, adjacent conductors may be spaced apart from each other by the first distance D1 or more on the first surface 202a, so the electrical short may be reduced.

Figure 12:
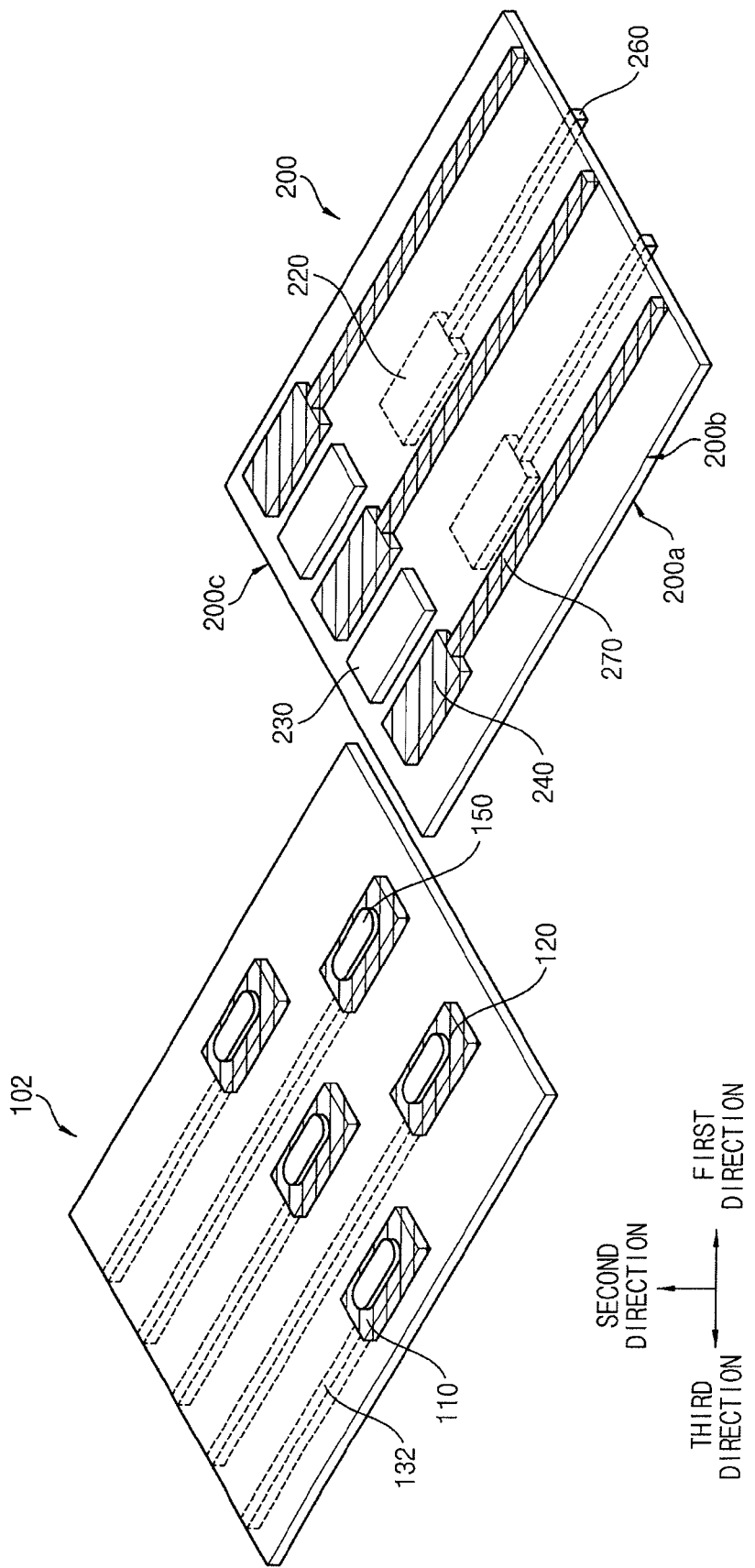
Figure 13:
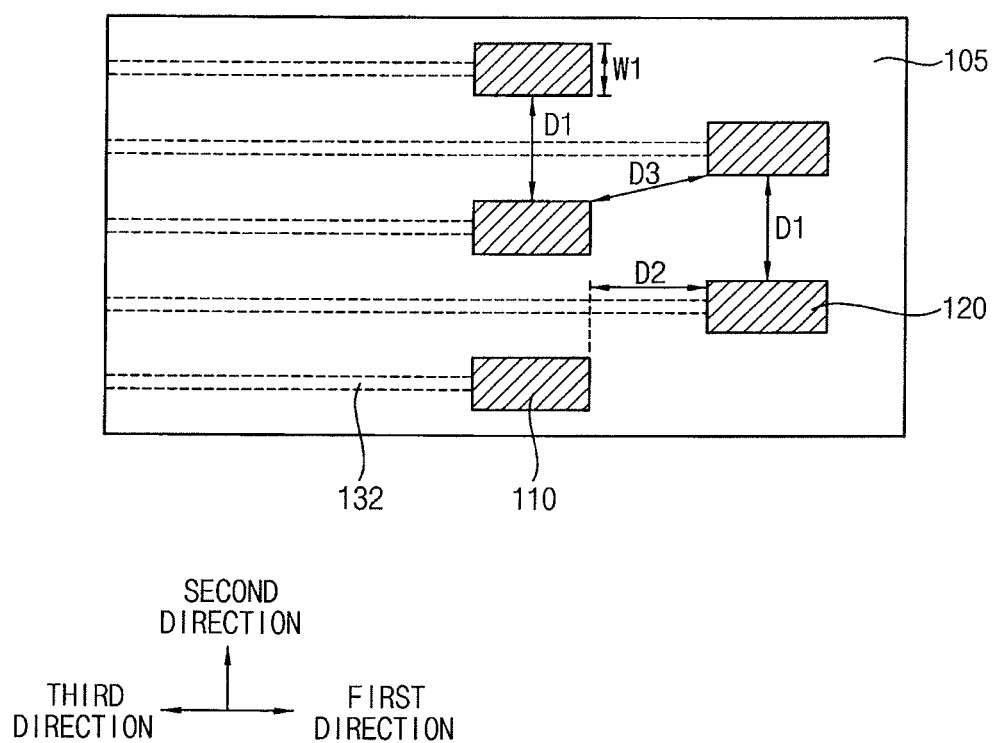

FIGS. 12 and 13 are a perspective view and a plan view illustrating a connection structure of a circuit board according to example embodiments, respectively.

FIG. 12 is a perspective view illustrating a connection structure of a circuit board according to example embodiments, and FIG. 13 is a plan view illustrating an upper surface of a first circuit board 102 according to example embodiments. For the purpose of convenience of explanation, a third wire 132 disposed at a hidden surface of the first circuit board 102 is illustrated in a dotted line in FIG. 13.

Referring to FIG. 12, the connection structure of a circuit board includes a first circuit board 102, a second circuit board 200, and an adhesive member 150 disposed between the first circuit board 102 and the second circuit board 200.

Referring to FIG. 13, the first circuit board 102 may include a first base layer 105, and a first connection pad 110 and a second connection pad 120 disposed on an upper surface of the first base layer 105.

The first connection pads 110 and the second connection pads 120 may be alternately and repeatedly disposed in a staggered pattern in the second direction. In some example embodiments, each of the first connection pad 110 and the second connection pad 120 may have a first width W1 in the second direction. In this case, adjacent first connection pads 110 may be spaced apart from each other in the second direction by the first distance D1, and adjacent second connection pads 120 may be spaced part from each other in the second direction by the first distance D1. Meanwhile, the first connection pad 110 may be spaced apart from the second connection pad 120 in the first direction by the second distance D2. In some example embodiments, the shortest distance between the first connection pad 110 and the second connection pad 120 may be defined as a third distance D3, and the third distance D3 may be substantially greater than the first distance D1.

Meanwhile, each of the first and second connection pads 110 and 120 may be electrically connected to each of the third wire 132. However, the third wires 132 may be disposed at a bottom surface of the first circuit board 102 or inside the first circuit board 102. That is, the third wires 132 are not exposed to an upper surface of the circuit board 102. If the third wires 132 are exposed to the upper surface of the first circuit board 102, the third wires 132 may be spaced apart from the first connection pads 110 by a distance shorter than the first distance D1. If the distance between adjacent conductors is reduced, an electrical short may be caused easily. In some example embodiments, since the third wires 132 are disposed at the bottom surface of the first circuit board 102 or inside the first circuit board 102, the distance between adjacent conductors is increased so that the electrical short may be prevented.

As shown in FIG. 12, the second circuit board 200 is substantially the same as the second circuit board 200 described with reference to FIGS. 1 to 6. In other example embodiments, the second circuit board is substantially the same as the second circuit board 202 described with reference to FIGS. 7 to 11.

The adhesive material 150 may be disposed between the first circuit board 102 and the second circuit board 200, and may include an anisotropic conductive film. Pressure may be applied to the adhesive member 150 during a procedure of bonding the second circuit board 200 to the first circuit board 102, and accordingly, a shape of the adhesive member 150 may be deformed. If a spacing distance between adjacent conductors (that is, a pad or a wire) is short, the adhesive member 150 electrically connects undesirable conductors to each other so that a short circuit may easily occur. In some example embodiments, the connection pads 110 and 120 may be disposed in a staggered pattern and the third wire 132 may not be disposed on the upper surface of the first circuit board 102. Accordingly, adjacent conductors can be spaced apart from each other by the first distance D1 more on the upper surface of the first circuit board 102, so the short may be reduced.

The present inventive concept may be applied to a system having an organic light emitting display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A connection structure of a circuit board comprising:
a first circuit board on which a first connection pad and a second connection pad are disposed;
a second circuit board having a first surface facing the first circuit board, wherein a plurality of third connection pads and a plurality of fourth connection pads are disposed on the first surface in a staggered pattern; and
an adhesive member disposed between the first and second circuit boards,
wherein at least one of the third and fourth connection pads is electrically connected to a wire which is disposed on a second surface of the second circuit board opposite to the first surface of the second circuit board, and
wherein a dummy pad is disposed between a plurality of fifth connection pads that are disposed on the second surface and electrically connected to the wire.

2. The connection structure of claim 1, wherein the third and fourth connection pads are alternately and repeatedly disposed in a second direction, and
wherein the third connection pads are disposed closer to an end of the second circuit board than the fourth connection pads in a first direction substantially perpendicular to the second direction.

3. The connection structure of claim 2, wherein each of the third connection pads is electrically connected to a second wire disposed on the second surface of the second circuit board, and wherein each of the fourth connection pads is electrically connected to a first wire disposed on the first surface of the second circuit board.

4. A connection structure of a circuit board comprising:
a first circuit board on which a first connection pad and a second connection pad are disposed;
a second circuit board having a first surface facing the first circuit board wherein a plurality of third connection pads and a plurality of fourth connection pads are disposed on the first surface in a staggered pattern; and
an adhesive member disposed between the first and second circuit boards,
wherein at least one of the third and fourth connection pads is electrically connected to a wire which is disposed on a second surface of the second circuit board opposite to the first surface of the second circuit board,
wherein the third and fourth connection pads are alternately and repeatedly disposed in a second direction,
wherein the third connection pads are disposed closer to an end of the second circuit board than the fourth connection pads in a first direction substantially perpendicular to the second direction,
wherein each of the third connection pads is electrically connected to a second wire disposed on the second surface of the second circuit board, wherein each of the fourth connection pads is electrically connected to a first wire disposed on the first surface of the second circuit board,
wherein the second circuit board further comprises a plurality of fifth connection pads disposed on the second surface of the second circuit board, and
wherein each of the fifth connection pads is electrically connected to each of the third connection pads through a first contact formed through the second circuit board while being directly connected to each of the second wires.

5. The connection structure of claim 4, wherein the second circuit board further comprises a dummy pad disposed between the fifth connection pads.

6. The connection structure of claim 5, wherein the dummy pad has a height substantially equal to the height of the fifth connection pads, and comprises an insulation material.

7. The connection structure of claim 2, wherein each of the third connection pads is electrically connected to a second wire disposed on the second surface of the second circuit board, and wherein each of the fourth connection pads is electrically connected to a first wire disposed on the second surface of the second circuit board.

8. A connection structure of a circuit board comprising:
a first circuit board on which a first connection pad and a second connection pad are disposed;
a second circuit board having a first surface facing the first circuit board, wherein a plurality of third connection pads and a plurality of fourth connection pads are disposed on the first surface in a staggered pattern; and
an adhesive member disposed between the first and second circuit boards,
wherein at least one of the third and fourth connection pads is electrically connected to a wire which is disposed on a second surface of the second circuit board opposite to the first surface of the second circuit board,
wherein the third and fourth connection pads are alternately and repeatedly disposed in a second direction,
wherein the third connection pads are disposed closer to an end of the second circuit board than the fourth connection pads in a first direction substantially perpendicular to the second direction,
wherein each of the third connection pads is electrically connected to a second wire disposed on the second surface of the second circuit board, wherein each of the fourth connection pads is electrically connected to a first wire disposed on the second surface of the second circuit board, wherein the second circuit board further comprises a plurality of fifth connection pads and a plurality of sixth connection pads which are disposed on the second surface of the second circuit board, wherein each of the fifth connection pads is electrically connected to each of the third connection pads through a first contact formed through the second circuit board while being directly connected to each of the second wires, and wherein each of the sixth connection pads is electrically connected to each of the fourth connection pads through a second contact formed through the second circuit board while being directly connected to each of the first wires.

9. The connection structure of claim 8, wherein the second circuit board further comprises a dummy pad disposed between the fifth connection pads.

10. The connection structure of claim 9, wherein the dummy pad has a height substantially equal to the height of the fifth connection pads, and comprises an insulation material.

11. The connection structure of claim 1, wherein the first and second connection pads are disposed in a staggered pattern.

12. The connection structure of claim 11, wherein the first and second connection pads are electrically connected to a third wire disposed on an upper surface of the first circuit board, respectively.

13. The connection structure of claim 11, wherein the first and second connection pads are electrically connected to a third wire disposed inside the first circuit board or at a lower surface of the first circuit board.

* * * * *